Figure 1:
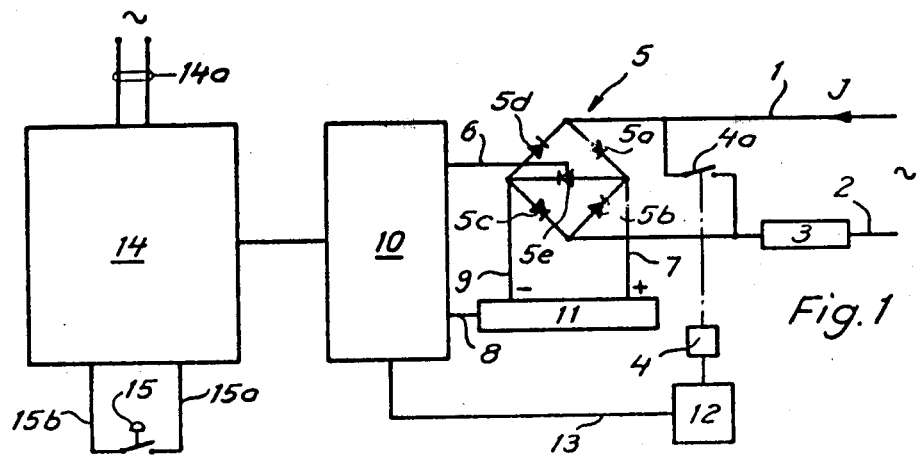

United States Patent [19]

Hjertman

[11] 4,225,895
[45] Sep. 30, 1980

[54] DEVICE FOR CLOSING OR INTERRUPTING AN ELECTRIC ALTERNATING CURRENT ARISING ON A LINE

[76] Inventor: Bengt N. V. Hjertman, 12235 Enskede, Stockholm, Sweden

[21] Appl. No.: 855,214

[22] Filed: Nov. 28, 1977

[51] Int. Cl.² ............................................. H02H 7/22
[52] U.S. Cl. .......................................... 361/8; 361/13
[58] Field of Search .................. 361/8, 13, 3, 5, 6; 307/137

[56] References Cited

U.S. PATENT DOCUMENTS

| | | | |
|---|---|---|---|
| 3,237,030 | 2/1966 | Coburn | 361/8 X |
| 3,365,654 | 1/1968 | Johnston | 323/22 |
| 3,558,910 | 1/1971 | Dale et al. | 361/13 X |
| 3,646,355 | 2/1972 | Ireland et al. | 361/13 X |
| 3,982,137 | 9/1976 | Penrod | 361/8 |
| 4,074,333 | 2/1978 | Murakami et al. | 361/13 |

OTHER PUBLICATIONS

RCA Silicon Power Circuits Manual, Technical Series SP-50, p. 236, Radio Corporation of America, 1967.

*Primary Examiner*—William M. Shoop
*Attorney, Agent, or Firm*—Oldham, Oldham, Hudak & Weber Co.

[57] ABSTRACT

The present invention relates to a device which is created in such a way that it can close or interrupt an electric alternating current arising on a line at its zero passage. The current mentioned is provided for the feed of energy to a load. The closing or interrupting of the alternating current arising on the line takes place through an activation of an electronic switching means which is switched parallel to a contact that is contained in a mechanical switching means. The contact is in closed position during the load and at the beginning of a short persistence time after the switching in of the electronic switching means and before a brief persistence time before the interruption of the electronic switching means. The switching is instantaneous because the electronic switching means is always activated by a separate energy source.

3 Claims, 3 Drawing Figures

DEVICE FOR CLOSING OR INTERRUPTING AN ELECTRIC ALTERNATING CURRENT ARISING ON A LINE

It is already known that the interrupting and closing of an electric alternating current can be accomplished with the aid of mechanical contact members, for example contacters, relays or the like. After the closing and interrupting occurs at undetermined times, it often happens that the closing or interrupting takes place at times when both the current and also the voltage have peak values. This means, then, that the mechanical contact for the closing or interruption of an appreciable effect has to be dimensioned.

There was proposed, however, an electronic switching means which is to provide for both the switching in or closing, and also the interruption of an electric alternating current at the zero passage of the alternating current.

It is obvious that the components of the electronic switching means there must be dimensioned in such a way that the endure strong currents during a long time, which renders the switching means substantially expensive. Furthermore, the strong current through the switching means will trigger a strong heat development, by reason of the relatively poor efficiency.

The present invention relates to a device which makes possible the closing of an alternating current occurring on a line at its zero passage and the interruption of the alternating current occurring on the line at its zero passage. The device makes use of a mechanical switching means, a contact belonging to this, and also an electronic switching means.

Through the device according to the present invention it is made possible to reduce the components of the electronic switching means in relation to the nominal effect of the device, since the electronic switching means is in operation only for the switching on or switching off of effect during a short time.

What is primarily characteristic for a device according to the present invention is indicated in the characterizing portion of claim 1.

Figure 2:
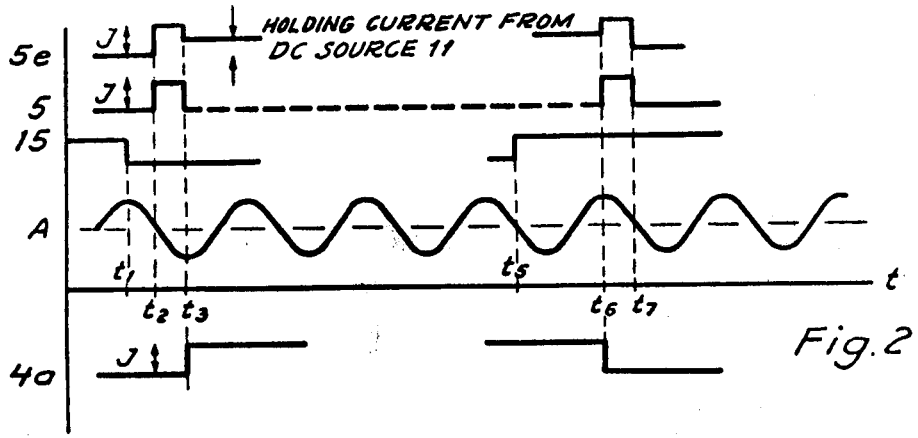
Figure 3:
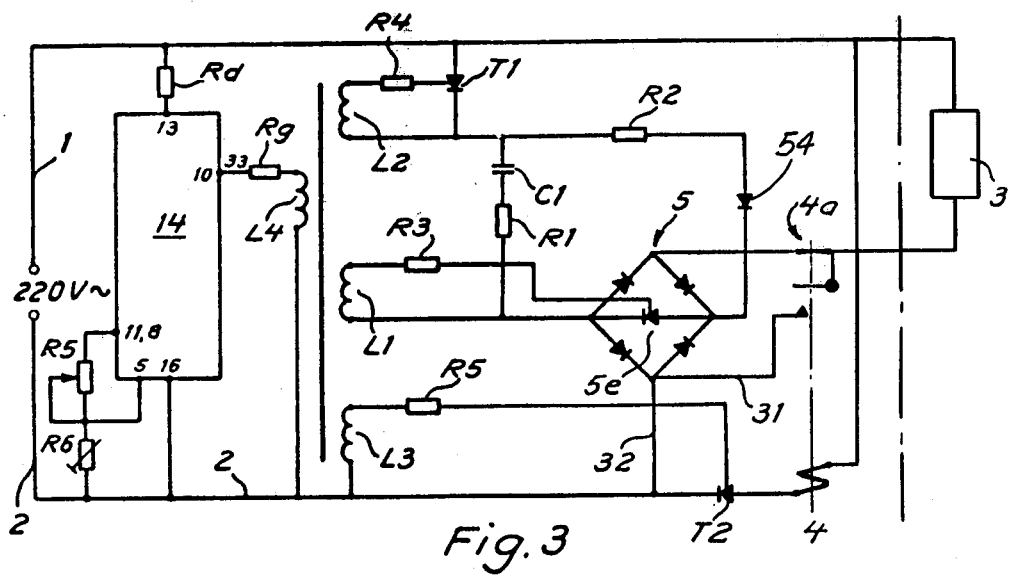

A form of execution suggested at present, which has the special features for the present invention is described with reference to the appended drawing, in which FIG. 1 shows in block diagram form the theoretical structure of the device;

FIG. 2 shows a time course scheme over the coarse of events for the various members of the form of execution according to FIG. 1, and FIG. 3 shows an example of a schematic drawing of the circuitry for a device according to the present invention, in use in a time-proportional control of a heating apparatus.

In FIG. 1 there is shown a device which is intended to be able to close or interrupt an alternating current occuring on a line at its zero passage. The alternating current comes from a main and appears on the lines 1 and 2. In series with the line 2 there is switched in a laod 3. This load 3 could actually be inductive or capacitive, but in the following description it is to be assumed that the load 3 is resistive or at least substantially resistive, which has the consequence that the electric alternating current and the electric alternating voltage receive their zero passages simultaneously. The switching in of the load can take place either over a first mechanical switching means 4 or over a second electronic switching means connected parallel to the first switching means. To the electronic switching means there was given the reference designation 5.

The electronic switching member 5 has four diodes 5a-5d connected in the bridge circuit. Between the connecting points for the diodes 5a and 5b as well as of the diodes 5c and 5d there is connected an electronically controllable semiconducting element in the form of a thyristor. To this thyristor there was given the reference designation 5e. The control electrode of the thyristor is connected over a line 6 to a puls separating circuit, for example in the form of a transformer or of a photoelectric switch. To this pulse separating circuit there was given the reference designation 10.

The connecting point for the diodes 5a and 5b is connected over a line 7 to a direct-voltage supply 11, preferably provided with a control device which is switched on over a line 8 from the pulse separating circuit 10. The connecting point between the diodes 5c and 5d is connected over a line 9 to the direct-voltage supply 11. The line 7 is provided for a plus potential, whereas for the line 9 a minus potential is provided.

From the pulse separating circuit 10 over a line 13 a relay 4 is activatable, preferably provided with a control device 12, in which the relay 4 operates a contact 4a which is contained in the first mechanical switching means 4.

The pulse separating circuit 10 is controlled by an electric control device 14 and this can be provided with a time-proportional zero-passage regulation. To the electronic control device a supply voltage is connected over the line bundle 14a. A contact 15 is connected over lines 15a and 15 b to the electronic control device and the operation of the contact 15 activates the closing or interruption of the electric alternating current occurring onthe line. This alternating current is designated with I.

In FIG. 2 there is shown a time course diagram of the functions of the parts contained in FIG. 1. The curve A shows the alternating current or the alternating voltage that occurs on the line 1 and 2 and it is assumed, furthermore, that at the time point t1 the contact 15 is closed, which has the consequence that the electronic control device 14 is operated and senses over the pulse separating circuit 10 the alternating current or the alternating voltage on the lines 1 and 2. At the time point t2 the electronic switching means 5 is operated, which has the consequence that the alternating current is allowed to pass the electronic switching means 5 and the load 3. At time point t2 the contact 4a of the contact 4a is still in open position. The electronic control device 14 can either be such that it simultaneously gives off a pulse to the switching means 5 and the relay 4 after the relay 4 has a delay at the time point, or such that an indication in this regard is awaited that the switching means 5 actually has switched on the current from the line 1 in order to pass through said switching means 5 and the load 3 before an operating pulse is dispensed over the pulse separating circuit 10 on the line 13 in order to operate the control device 12.

It is assumed that at the time point t3 the contact 4a of the relay is closed, which has the consequence that the current I can pass over the contact 4a now to the load 3.

In view of the fact that the electronic switching means 5 is present only for the purpose making possible for the load current I the passage between the time segments t2 and t3, it is understandable that the members contained in the switching means 5 can be substantially reduced in dimensions in relation to the expected alternating current, since the heat development in the switching means 5 is very slight.

As soon as the mechanical switching means, the relay 4, occupies a closed position, the electronic switching means 5 has fulfilled its assignment and this switching means could be completely switched off at time point t3 or allow a weak holding current the passage through the semiconducting element. The holding current from 11 can possibility be switched on again shortly before the switching off of the relay (for example during the switch-off time).

It is taken into account that the semiconducting element 5e is either activated by the holding current as long as the mechanical contact is closed, or only during a short time before the contact opens.

If it is assumed that at the time point t5 the contact 15 occupies an open position in order thereby to interrupt the electric alternating current on the line 1 through the load 3 and the line 2, the control device for the direct-current supply 11 should be operated in order thereby to feed current to the electronic switching means 5e. Through this current the switching means 5e is caused to burn (zum Brennen gebracht). At time point t6 the relay is enabled to drop, whcih has the consequence that the contact 4a assumes an open position and the current I will now pass only through the electronic switching means 5. With the aid of the pulse separating circuit 10 of the electronic control device 14, now the electronic switching means 5 will perceive the zero passage of the current, which sets in at time point t7, in which process the switching means 5 interrupts the electric alternating current I.

From the preceding description of the functioning of the present device and the interaction of the various members contained in it among one another it is evident that a separate current source 11 is present in order to maintain burning the semiconductor element 5e during the time segment or a portion thereof as long as the mechanical contact 4a is in closed position and in this situation short-circuits the electronic switching means. The current I is taken over from the mechanical contact 4a onto the electronic switching means 5 when the mechanical contact opens, which takes place immediately before the time point when the electronic switching means is to interrupt the current at its zero passage. The current I is taken over from the electronic switching means onto the mechanical contact or contact member when the mechanical contact member occupies a closed position, which occurs immediately after the time point when the electronic switching means is to switch in the current at its zero passage.

The separate voltage and current source 11 can consist either of a direct-current battery or of an alternating-current fed direct current source.

In FIG. 3 there is shown a detailed switching diagram on the device according to FIG. 1 and from FIG. 3 it is evident that the voltage source consists of 220 V alternating current and is connected to the lines 1 and 2. The load was given the reference designation 3 and this is connected over a mechanical switching means 4, a line 31 and a line 32 to said line 2. Parallel over the mechanical switching means 4a there is switched in the electronic switching means 5, the direct-current supply taking place over a thyristor T1 which is connected to a capacitor C1, which, in turn, is connected over a resistance R1, in part a resistance R2 to the two sides of the semiconductor element 5e. Over a resistance R3 and a winding L1 of a transformer the electric switching means 5e is switched on (at t2). The direct-current supply is switched in over a winding L2 of the transformer and a resistance R4 connected to the thyristor T1. Over a winding L3 and a resistance R2 a thrystor T2 is switched on for the operation of the relay winding 4.

As soon as a balancing circuit that is connected to the electronic control device 14, in the form of an ignition circuit (for example Philips TCA 280) that is operated by the resistance of the thermistor R6 requires more heat, pulses are emitted on the line 33, which generate over a resistance Rg and and winding L4 on the transformer pulses on the windings L1–L3. The winding L1 switches on the semiconducting element 54, the winding L2 switches on the thyristor T1, which gives a "holding current" to the thyristor 5 e and the winding L3 switches on the thyristor T2 for the activation of the relay 4. The capacitor C1 is charged by the direct-current of the thyristor T1. When the ignition circuit interrupts the pulses on the line 33 (the heat is to be interrupted) the thyristors T1 and T2 are extinguished. Thereby the current through the relay winding 4 is interrupted. During the switch-off time of the relay the semiconductor 5e is kept burning with current from the earlier charged capacitor. When the relay falls, the semiconductor 5e goes out at the first zero passage, after the current from the capacitor C1 has fallen below a critical holding current value.

By reason of the inertia of the relay 4 in the switching-in, and also in the switching off, it is possible for the electronic switching means 5 to execute its function before the contact 4a of the mechanical switching means occupies a closed or interrupted position.

The invention is not, of course, limited to the form of execution indicated above as an example, but can be subjected to modifications within the framework of the following patent claims.

It should be heeded that the electronic switching means can be kept activated or burning through the separate current feed, although the whole switch-on circuit for the electronic switching means 5 is short-circuited by the mechanical contact 4a. The generation of the current mentioned in the member 11 can, of course, take place in any desired manner.

Primarily it should be heeded that the electronic switching means in the example of execution is represented with a bridge circuit containing four diodes and a semiconducting element which is diagonally switched in, that, however, this circuit can be executed in another manner, for example, two diodes and two thyristors with short-circuited diagonal.

What is claimed is:

1. A device for the closing or interrupting of an alternating current (I) arising on a line (1,2) at its zero passage, in which the current (I) is utilized for the supply of energy to a load (3), which closing or interrupting of the current (I) is provided by the activation of an electronic switching means (5) characterized in that the electronic switching means (5) is switched parallel to a mechanical contact (4a), a separate current source (11) connected to the switching means (5);

the mechanical contact (4a) having a closed position to short circuit the switching means (5), a semiconductor element (5e) connected to the switching means (5) being electrically actuated by the current source (11) when the contact (4a) is in the closed position, said switching means (5) arranged to bring about a switching on or off of current to the load (3) at the zero passage ($t_2$, $t_7$) of the current, the mechanical contact (4a) being in the closed position during the switch-on time of the load, at the beginning ($t_3$) of a short persistance time ($t_2-t_3$), after the switching on of electronic switching means ($t_2$), and for a short persistance time ($t_6-t_7$) before the interruption ($t_8$) of the electronic switching means, an electronic control device (14) connected to a pulse separating circuit (10) which in turn controls the element (5e), said device (14) activated by the pulse separating circuit (10) to actuate the current source (11) as well as a control device (12) for a relay (4) which operates the mechanical contact (4a), and wherein the current source (11) is a direct current.

2. A device according to claim 1 wherein the semiconductor element (5e) is a thyristor which has a control electrode, the control electrode connected directly to the pulse separating circuit (10), and a capacitor (C1) electrically associated between the pulse separating circuit (10), and the control electrode of the thyristor (5e), said capacitor C1 charged when the control device 14 is activated and discharging to the thyristor (5e) when control device (14) is deactivated.

3. A device according to claim 2 where the pulse separating circuit comprises a transformer having a plurality of secondary windings, each secondary winding output coil operating in conjunction with a semiconducting element or thyristor, to separately control the semiconductor element (5e), the mechanical contact (4a) and the relay (4), the thyristor (5e) being kept on during the switch-off time of the relay by the discharge current from the capacitor.

* * * * *